US010734999B1

(12) United States Patent
Yamada

(10) Patent No.: US 10,734,999 B1
(45) Date of Patent: Aug. 4, 2020

(54) MEASUREMENT CIRCUITS FOR LOGIC PATHS

(71) Applicant: GLOBALFOUNDRIES INC., Grand Cayman (KY)

(72) Inventor: Kenta Yamada, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/429,547

(22) Filed: Jun. 3, 2019

(51) Int. Cl.
*H03K 19/003* (2006.01)
*G01R 31/3177* (2006.01)
*G01R 31/317* (2006.01)
*G01R 31/3183* (2006.01)

(52) U.S. Cl.
CPC ... *H03K 19/00323* (2013.01); *G01R 31/3177* (2013.01); *G01R 31/31725* (2013.01); *G01R 31/31727* (2013.01); *G01R 31/318328* (2013.01)

(58) Field of Classification Search
None
See application file for complete search history.

(56) References Cited

U.S. PATENT DOCUMENTS

| | | | |
|---|---|---|---|
| 5,923,676 A | 7/1999 | Sunter et al. | |
| 6,075,418 A * | 6/2000 | Kingsley | G01R 31/31725 327/265 |
| 7,065,684 B1 * | 6/2006 | Chan | G01R 31/3016 714/700 |
| 7,190,233 B2 * | 3/2007 | Bhushan | G01R 31/2824 331/44 |
| 7,810,000 B2 | 10/2010 | Ngo et al. | |
| 9,882,564 B1 | 1/2018 | Zangi et al. | |
| 2015/0249428 A1 * | 9/2015 | Huynh | H03B 5/04 365/185.18 |

* cited by examiner

*Primary Examiner* — Minh D A
*Assistant Examiner* — James H Cho
(74) *Attorney, Agent, or Firm* — David Cain; Andrew M. Calderon; Roberts Calderon Safran & Cole, P.C.

(57) ABSTRACT

The present disclosure generally relates to semiconductor structures and, more particularly, to measurement circuits for logic paths and methods of manufacture. The circuit includes: a flip flop device outputting an output signal comprising an intrinsic delay; a logic path looping the output signal back to the flip flop device such that the intrinsic delay is to be received by the flip flop device; and an oscillator which feeds an input signal into the logic path and sweeps the input signal to alter the looped output signal thereby providing a maximum frequency of the logic path.

20 Claims, 4 Drawing Sheets

MEASUREMENT CIRCUITS FOR LOGIC PATHS

FIELD OF THE INVENTION

The present disclosure generally relates to semiconductor structures and, more particularly, to measurement circuits for logic paths and methods of manufacture.

BACKGROUND

In microelectronics, obtaining accurate measurements for maximum frequencies from logic paths can be problematic. As an example, devices which measure an in-line critical path delay for first fail mechanisms implement unnecessary multiplexers in the critical path, which can cause unnecessary delays. Additionally, these devices have an unnecessary loading cap added from the buffer, which can cause further unnecessary delays.

Other devices such as a circuit timing monitor with a selectable-path ring oscillator or a device having a BIST architecture for measuring integrated circuit delays also have drawbacks of unnecessary delays. Additionally, these known measurement devices do not accurately represent an actual path delay, because such devices typically do not include the flip flop intrinsic delay and setup time in the frequency measurement. Accordingly, these known measurement devices cannot measure an exact maximum frequency of a logic path.

SUMMARY

In an aspect of the disclosure, a circuit comprises: a flip flop device outputting an output signal comprising an intrinsic delay; a logic path looping the output signal back to the flip flop device such that the intrinsic delay is to be received by the flip flop device; and an oscillator which feeds an input signal into the logic path and sweeps the input signal to alter the looped output signal thereby providing a maximum frequency of the logic path.

In an aspect of the disclosure, a circuit comprises: a voltage-controlled oscillator (VCO); a flip flop device receiving an input signal from the VCO and outputting an output signal in response to the input signal; a logic path directly connected to the flip flop device and looping the output signal back to the flip flop device; and a variable control signal inputted into the VCO to switch the input signal from a first frequency to a second frequency thereby altering a frequency ratio of the looped output signal over the input signal from a one-half value to a one-fourth value to determine a maximum frequency of the logic path at an overlap between the one-half value and the one-fourth value.

In an aspect of the disclosure, a method comprises: inputting an input signal into a flip flop device; looping an output signal of the flip flop device back to the flip flop device through a logic path; changing a frequency of the flip flop device from a first setting to a second setting; obtaining a frequency ratio of the looped output signal over the input signal in response to the changed frequency; and determining a maximum frequency of the logic path at a point where the frequency ratio changes from an initial frequency ratio to the frequency ratio.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to measurement circuits for logic paths and methods of manufacture. In embodiments, the methods and structures provided herein allow for exact measurements of maximum frequencies from logic paths. More specifically, the measurement circuit described herein allows for a relative exact measurement of the maximum frequency of the logic path by accounting for flip flop intrinsic delay and setup time. In embodiments, the measurement circuit utilizes a ring oscillator and direct connections between the flip flop and logic path, thereby avoiding any unnecessary delays from extra components. Advantageously, the structures and processes described herein allow for a measurement circuit that accounts for flip flop intrinsic delay and setup time while avoiding unnecessary delays and being implementable into an actual logic circuit design, e.g., in scribe lines or other test sites.

In embodiments, a logic path is connected between input/output ports D and Q of a flip flop device, e.g., a D-type flip flop (DFF). An input frequency Vout is provided by an oscillator, e.g., a voltage-controlled oscillator (VCO), to a clock (CLK) port of the flip flop device. The D port of the flip flop device will output a frequency to the logic path which, in turn, will provide a feedback frequency Vq to the Q port of the flip flop device. This input frequency Vq includes any intrinsic delay between the CLK port and the D and Q ports. This is because the output from the D port is fed back into the Q port by the logic path. Further, the setup time of the flip flop device is automatically already included and accounted for since the intrinsic delay between the CLK port and the D and Q ports is accounted for.

Under normal (low frequency) conditions, the input frequency Vq is exactly one-half of the input frequency Vout. In this way, Vq/Vout=1/2. In order to determine a maximum frequency of the logic path, the input frequency Vout is varied from the low frequency setting to a high frequency setting. This switching of the input frequency Vout alters the ratio of Vq/Vout from 1/2 to 1/4. This change in the ratio of Vq/Vout correlates to a maximum frequency of the logic path. In this way, by providing a ratio between the frequencies Vq and Vout, a maximum frequency of the logic path can be found.

The measurement circuit described herein can be implemented in chip test structures, e.g., 25 pad block structures. More specifically, the measurement circuit can be implemented within product scribe lines for test element group (TEG) devices in multi-project wafers (MPWs). This allows for implementation for inline testing or device monitoring.

In embodiments, frequency dividers can be connected to the measurement circuit for relatively easier frequency measurements.

Figure 1A:
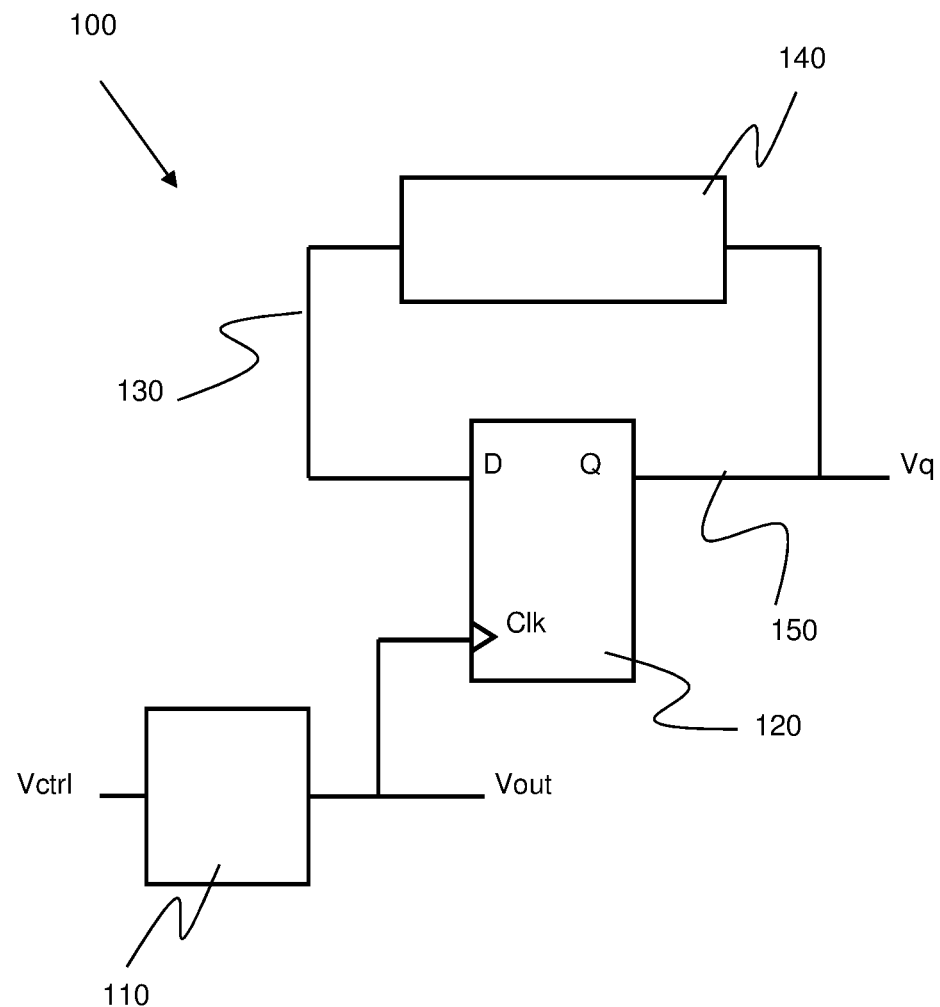
FIG. 1A shows a measurement circuit for measuring a maximum frequency of a logic path, amongst other features, and respective fabrication processes in accordance with aspects of the present disclosure.

FIG. 1A shows a measurement circuit 100 for measuring a maximum frequency of a logic path. The measurement circuit 100 comprises an oscillator 110 that receives a control voltage Vctrl. In embodiments, the oscillator 110 can be a voltage-controlled oscillator (VCO), which can be tuned over a wide range of frequencies through the application of Vctrl to the VCO. In this way, the structures and processes described herein further comprising an initial input signal, i.e., control voltage Vctrl, into the oscillator 110. The oscillator 110 outputs a voltage Vout, which is fed into a flip flop device 120.

The flip flop device 120 can be a data flip flop (DFF) having a data (D) port, a clock (CLK) port and a Q port. In response to receiving Vout from the oscillator 110, the D port outputs an output signal 130 to a logic path 140. In this way, the output signal is from the D port. In embodiments, any delay present between the CLK port and the D port from generating the output signal 130 from Vout will be included in the output signal 130 received by the logic path 140. In this way, a flip flop device 120 receives an input signal, i.e., voltage Vout, from the oscillator (VCO) 110 and outputs an output signal 130 in response to the input signal, i.e., voltage Vout.

The logic path 140 outputs a feedback signal Vq along a feedback path 150 in response to receiving the output signal 130. In embodiments, the logic path 140 can be from a digital circuit. Accordingly, the feedback signal Vq represents a flipped signal of the output signal 130. In this way, the looped output signal, i.e., feedback signal Vq, is a flipped signal of the output signal 130 outputted by the D port. More specifically, the structures and processes described herein comprise flipping the output signal, i.e., Vq, at the logic path 140. However, any delay between the CLK port and the D port present in the output signal 130 is still present in the feedback signal Vq. The feedback signal Vq from the logic path 140 is fed into the Q port of the flip flop device 120 through the feedback path 150. In this way, the Q port receives the looped output signal, i.e., feedback signal Vq.

As illustrated in FIG. 1A, there is a direct connection between the logic path 140 and the Q port of the flip flop device 120. In this way, the structures and processes described herein provide for logic path 140 directly connected to the flip flop device 120 and looping the output signal, i.e., feedback signal Vq, back to the flip flop device 120. By having a direct connection between the logic path 140 and the Q port with no extra components, e.g., multiplexers, any unnecessary delays can be avoided. In this way, no further delays are received by the Q port besides the delay between the CLK port and D port received from the feedback signal Vq.

Any additional clock cycles will contain any delays present between the CLK port and the Q port, in addition to the delay between the CLK port and D port. Accordingly, by having a feedback loop between the D and Q ports, the entire intrinsic delay of the flip flop device 120 can be captured and accounted for by the measurement circuit 100. In embodiments, the intrinsic delay between the CLK port and the D and Q ports can be defined as an amount of time the flip flop device 120 takes to change its output after the rising edge of the CLK port.

A setup time of the flip flop device 120 is automatically included in the intrinsic delay. In embodiments, the setup time can be defined as a minimum amount of time that data within the flip flop device 120 must be stable before it can be latched correctly, i.e., saved. In this way, the measurement circuit 100 also accounts for the setup time of the flip flop device 120 by accounting for the intrinsic delay of the flip flop. Accordingly, the measurement circuit 100 is configured to account for both the intrinsic delay and the setup time of the flip flop when determining a maximum frequency of the logic path 140. More specifically, the output signal 130 comprises an intrinsic delay between the clock (CLK) port and the D port and the clock (CLK) port and the Q port.

The clock of the flip flop device 120 can oscillate between low and high frequencies by tuning the oscillator 110 using the Vctrl to vary Vout from a low frequency to a high frequency. In this way, the oscillator 110 allows for sweeping of the frequency being inputted into the CLK port. Under low frequency conditions, Vq is equal to about one-half of Vout. That is, Vq=(1/2)Vout or, alternatively, Vq/Vout=(1/2). However, sweeping (switching) the output frequency Vout from a low frequency to a high frequency will modify Vq. More specifically, Vq will be about one-fourth of Vout when Vout is at a high frequency. That is, when Vout is at a high frequency Vq=(1/4)Vout or Vq/Vout=(1/4), as opposed to Vq/Vout=(1/2) under normal conditions. In this way, the structures and processes described herein allow for changing a frequency of the flip flop device from a first setting (low frequency) to a second setting (high frequency) by changing the output frequency Vout from a low frequency to a high frequency.

It is contemplated herein that the present disclosure is not limited to sweeping from a low frequency to a high frequency. Practically, any bisection method can be used to obtain a result relatively more quickly with sufficient resolution. For example, starting with a fixed voltage for Vctrl, such as a nominal Vdd, e.g., 0.8V for Vctrl, a frequency ratio of 1/8 is achieved. Then, for a subsequent simulation, Vctrl can be set to 0.4V, with a frequency ratio of 1/4 being achieved. Subsequent simulations using 0.2V for Vctrl achieved a ratio of 1/2, and so on. In this way, the sweeping of the frequency can be a changing of a high frequency to a low frequency.

Figure 1B:
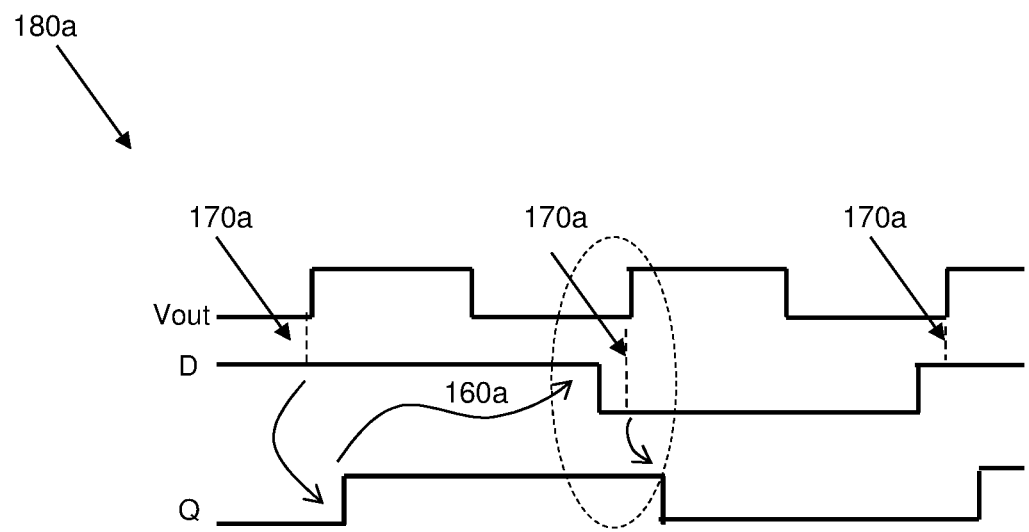
FIGS. 1B and 1C show timing charts for low and high frequencies in accordance with aspects of the present disclosure.
Figure 1C:
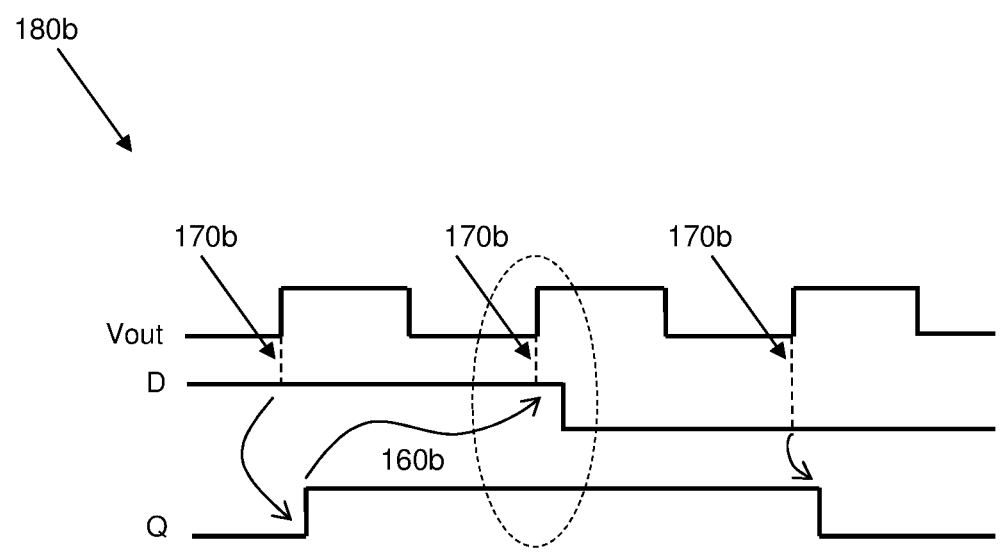

FIGS. 1B and 1C show the effects of varying Vout from a low frequency to a high frequency. Specifically, FIG. 1B represents a Vout measurement at a low frequency setting 180a, where Vq/Vout=(1/2). Further, FIG. 1C represents a Vout measurement at a high frequency setting 180b where Vq/Vout=(1/4). At the low frequency setting 180a, the logic path delay 160a of the logic path 140, i.e., the intrinsic delay and setup time of the flip flop device 120, is smaller than the Vout cycle. More specifically, at the low frequency setting 180a, the clock cycle, represented by Vout, is large enough to capture the logic path delay 160a because a rising edge 170a of the clock occurs after an edge of the D port cycle. Accordingly, the flip flop device 120 correctly captures a change in the feedback signal Vout at a next rising edge of Vout as the intrinsic delay and setup delay of the logic path 140 is smaller than the Vout cycle.

In embodiments, sweeping the output frequency Vout of the oscillator 110 from a low frequency setting to a high frequency setting will result in the frequency ratio Vq/Vout to suddenly go down from about one-half to about one-fourth at some output frequency of the oscillator 110. Alternatively, the present disclosure is not limited to sweeping from a low frequency. Practically, any bisection method can be used to obtain a result relatively more quickly with sufficient resolution. For example, starting with a fixed voltage for Vctrl, such as a nominal Vdd, e.g., 0.8V for Vctrl, a frequency ratio of 1/8 is achieved. Then, for a subsequent simulation, Vctrl can be set to 0.4V, with a frequency ratio of 1/4 being achieved. Subsequent simulations using 0.2V for Vctrl achieved a ratio of 1/2, and so on. In this way, the sweeping of the frequency can be a changing of a high frequency to a low frequency. Specifically, a variable control signal (control voltage Vctrl) is inputted into the oscillator (VCO) 110 to switch the input signal (Vout) from a first frequency to a second frequency thereby altering a frequency ratio of the looped output signal over the input signal, i.e., Vq/Vout, from a one-half value to a one-fourth value, thereby determining a maximum frequency of the logic path at an overlap between the one-half value and the one-fourth value.

The point at which there is a change in the frequency ratio Vq/Vout is the maximum frequency of the logic path 140. Accordingly, FIG. 1C illustrates that by switching from a low frequency setting 180*a* to a high frequency setting 180*b*, the logic path delay 160*b* is larger than the Vout cycle. More specifically, at the high frequency setting 180*b*, the clock cycle represented by Vout is unable to capture the logic path delay 160*b* because the rising edge 170*b* of the clock ends before an edge of the D port cycle. Specifically, the DFF flip flop device 120 cannot capture a change of the feedback signal Vout at a next rising edge of Vout because the intrinsic delay and the setup delay of the logic path 140 is larger than the Vout cycle.

Since the logic path delay is no longer able to be captured, the frequency of the logic path is at a maximum frequency. In this way, the structures and processes described herein provide for a flip flop device 120 outputting an output signal 130 comprising an intrinsic delay. Further, a logic path 140 loops the output signal 130 back to the flip flop device 120 such that the intrinsic delay is to be received by the flip flop device. Additionally, the structures and processes described herein provide for an oscillator 110 which feeds an input signal, i.e., Vout, into the logic path 140 and sweeps the input signal to alter the looped output signal, i.e., Vq, thereby providing a maximum frequency of the logic path 140.

Accordingly, the initial input signal, i.e., Vctrl, is swept from a first frequency (low frequency setting) to a second frequency (high frequency setting). In this way, the changing of the frequency of the flip flop device 120 from the low setting/first setting (low frequency) to the high setting/second setting (high frequency) alters the looped output signal, i.e., Vq. Further, the second frequency is higher than the first frequency and the second frequency, i.e., high frequency setting, alters the looped output signal, i.e., Vq. Specifically, the second frequency alters a frequency ratio of the looped output over the input, i.e., Vq/Vout.

Figure 2A:
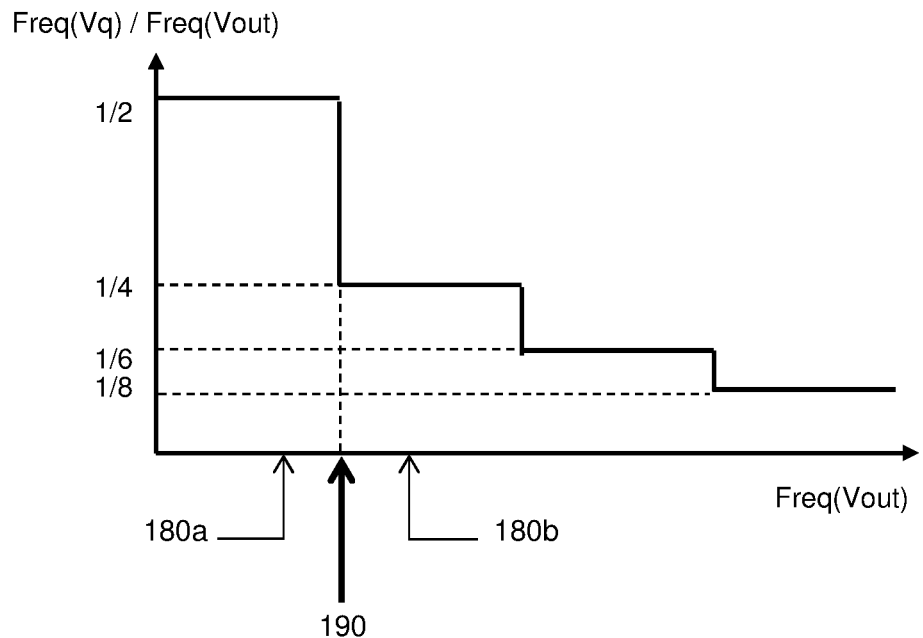
FIGS. 2A and 2B show measurement charts for the frequencies of FIGS. 1B and 1C in accordance with aspects of the present disclosure.
Figure 2B:
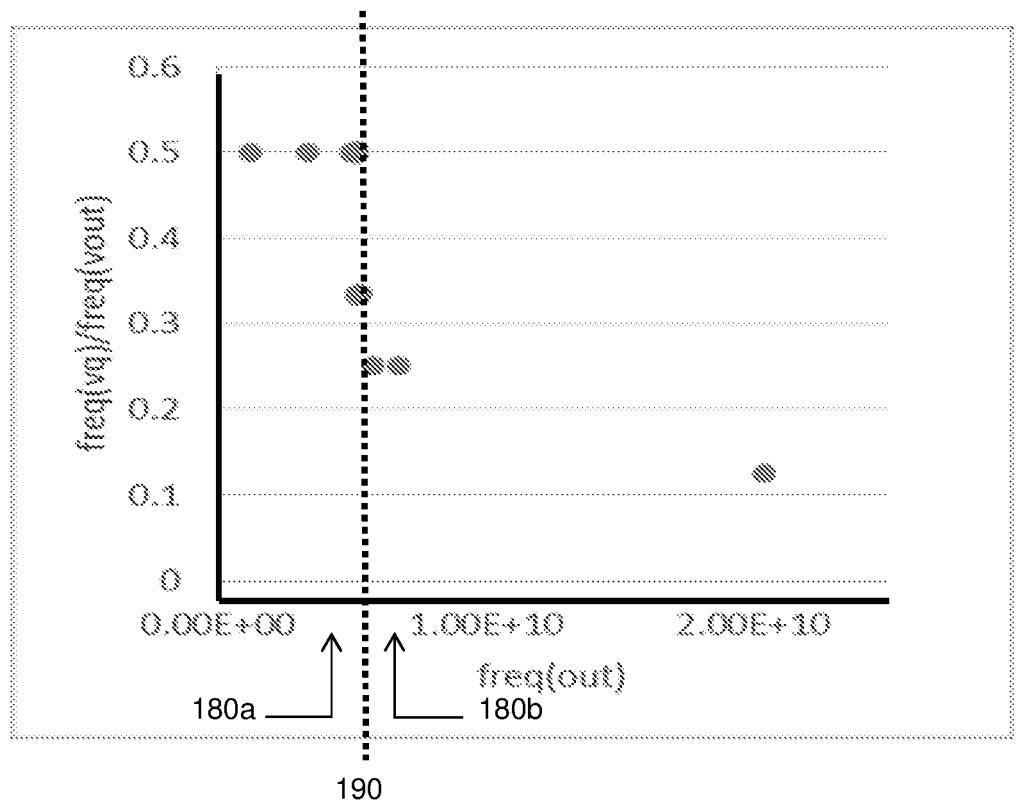

FIGS. 2A and 2B illustrate how the measurement circuit of FIG. 1A determines the maximum frequency of the logic path 140 in view of the low and high frequencies 180*a*, 180*b* of FIGS. 1B and 1C. FIG. 2A illustrates the point 190, at which the frequency ratio of Vq/Vout switches from about one-half to about one-fourth, i.e., when the frequency is switched from a low frequency setting 180*a* to a high frequency setting 180*b*.

Measuring Vq and Vout at the low frequency setting and finding a first frequency ratio Vq/Vout, and measuring then Vq and Vout again at the high frequency setting to finding a second frequency ratio Vq/Vout, allows for the maximum frequency of the logic path 140 to be determined when the first frequency ratio switches from about one-half to about one-fourth. In this way, the sweeping (switching) of the frequencies correlates to a maximum frequency of the logic path 140 at the point where the first frequency ratio switches from about one-half to about one-fourth for the second frequency ratio. This is because at the high frequency setting 180*b*, the logic path delay can no longer be captured, i.e., a maximum frequency is reached. In this way, the point 190 at which the frequency ratio of Vq/Vout changes from about one-half to about one-fourth is the maximum frequency of the logic path since no higher frequency can be obtained. Accordingly, the structures and processes described herein provide for determining a maximum frequency of the logic path at a point where the frequency ratio changes from an initial frequency ratio to the frequency ratio.

FIG. 2B shows actual simulation results of the structures and processes described herein. As illustrated in FIG. 2B, the first frequency ratio is at about 0.5 during the low frequency setting 180*a*, while the second frequency ratio is at about 0.25 during the high frequency setting 180*b*. The point 190 illustrates the maximum frequency of the logic path, e.g., 5.18 GHz, which is the point where the first frequency ratio switches from 0.5 to about 0.25 which is the second frequency ratio value. It is contemplated herein that the frequency ratio of Vq/Vout can switch to and from other ratios, e.g., 1/6 to 1/8, amongst other examples.

Figure 3:
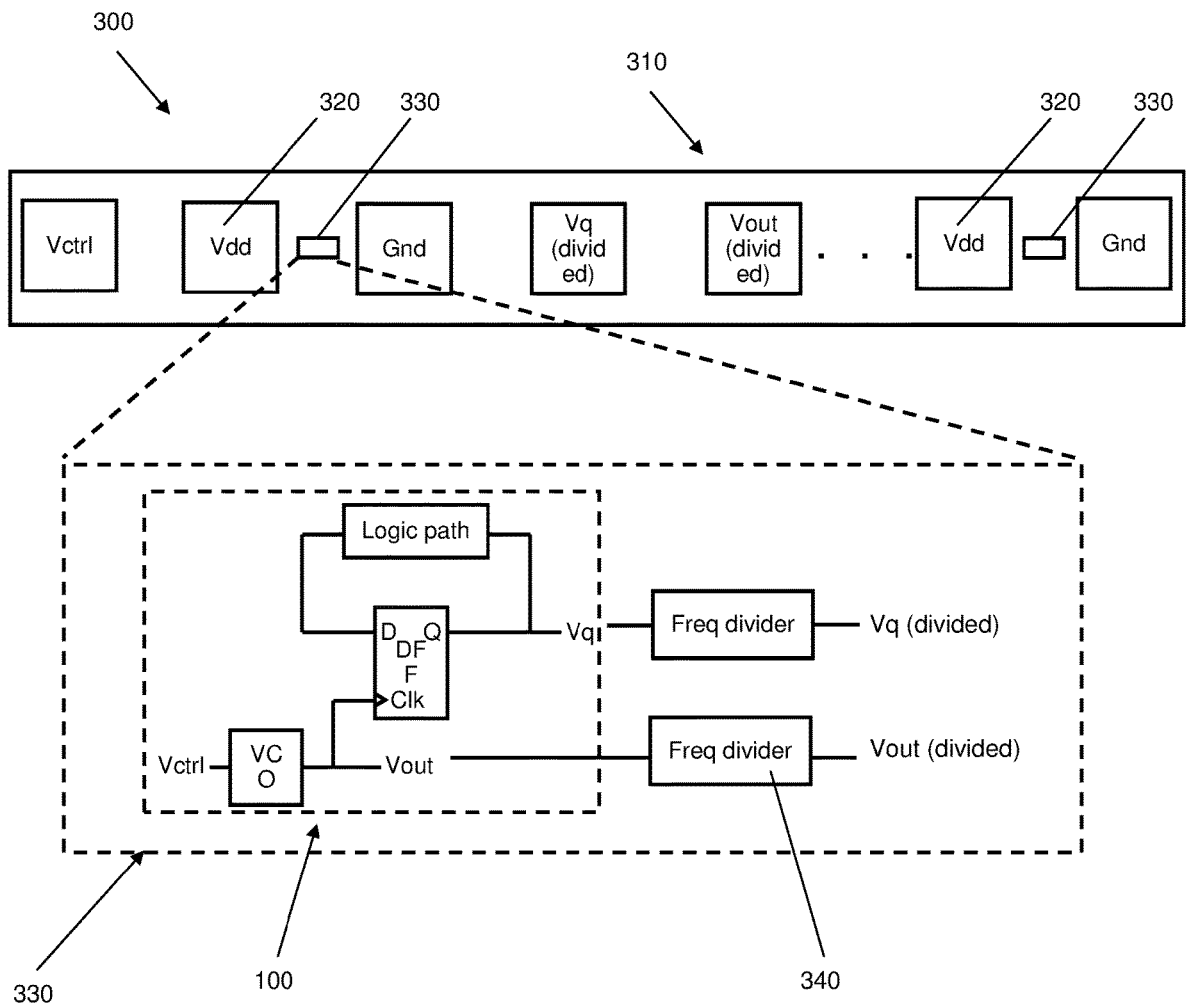
FIG. 3 shows an implementation of the measurement circuit of FIG. 1A in accordance with aspects of the present disclosure.

FIG. 3 shows an implementation 300 in chip test structures for the measurement circuit 100 of FIG. 1A. In embodiments, the chip test structures can be pad block structures 320 implemented within product scribe lines 310 for test element group (TEG) devices in multi-project wafers (MPWs). It is also contemplated herein that the measurement circuit can be implemented within other areas of the wafer, e.g., active areas. Accordingly, the measurement circuit 100 is configured for implementation within the wafer for inline testing or device monitoring.

The measurement circuit 100 is implemented into the circuit 330 along with frequency dividers 340. The frequency dividers 340 are implemented to allow for relatively easier measurements for determining the frequency ratio Vq/Vout. More specifically, the Vq frequency value can be relatively very high, and adding the frequency dividers 340 allows for a simpler calculation, e.g., allowing for the frequency ratio Vq/Vout to be equal to 1 MHz, instead of a value of 1 GHz which Vq can be equal to. Accordingly, dividing the relatively high frequency value of Vq allows for relatively easier calculations to find the maximum frequency of the logic path 140. In embodiments, the frequency dividers 340 can be ten stage frequency dividers 340, e.g., for a ring oscillator monitoring circuit. In this way, the structures and processes described herein comprise at least one frequency divider 340 receiving the looped output signal, i.e., Vq, from the logic path 140.

In embodiments, lowering the frequency will make the frequency measurement relatively easier to obtain, such as 25 pad block structures. In an illustrative, non-limiting example, FIG. 3 illustrates multiple pad block structures 320, although other amounts of pad block structures 320 are contemplated herein. As an example, five of the pad block structures 320 can be dedicated for the logic path 140, e.g., Vctrl, Vdd, Gnd, Vq and Vout.

In embodiments, some of the pad block structures 320, e.g., Vctrl, Vq and Vout, can be shared with other test structures for different logic paths which can have a maximum frequency measured. The pad block structures 320 can be repeated within the scribe line 210 of the wafer for inline testing of the different logic paths. In embodiments, a voltage source is provided to Vctrl/Vdd/Gnd pad block structures 320, while a frequency measurement is obtained at the Vq/Vout pad block structures 320 to determine the frequency ratio Vq/Vout to find the maximum frequency of the logic path 140.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on semiconductor (such as silicon) wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a flip flop device outputting an output signal comprising an intrinsic delay;
   a logic path receiving the output signal from the flip-flop device and looping the output signal back to an input of the flip flop device such that the intrinsic delay is to be received by the flip flop device;
   an oscillator which feeds an input signal into a clock port of the flip-flop device and which sweeps the input signal to alter the looped output signal thereby providing a maximum frequency of the logic path; and
   at least one frequency divider receiving the looped output signal from the logic path.

2. The circuit of claim 1, wherein the flip flop device comprises the clock port, a D port and a Q port.

3. The circuit of claim 2, wherein the output signal is from the Q port.

4. The circuit of claim 3, wherein the D port receives the looped output signal.

5. The circuit of claim 4, wherein the looped output signal is a flipped signal of the output signal outputted by the Q port.

6. The circuit of claim 1, further comprising an initial input signal into the oscillator.

7. The circuit of claim 6, wherein the initial input signal is swept from a first frequency to a second frequency.

8. The circuit of claim 7, wherein the second frequency is higher than the first frequency.

9. The circuit of claim 8, wherein the second frequency alters the looped output signal.

10. The circuit of claim 9, wherein the second frequency alters a frequency ratio of the looped output signal over the input signal.

11. A circuit, comprising:
    a voltage-controlled oscillator (VCO);
    a flip flop device receiving an input signal from the VCO and outputting an output signal in response to the input signal;
    a logic path directly connected to the flip flop device and looping the output signal back to the flip flop device;
    a variable control signal inputted into the VCO to switch the input signal from a first frequency to a second frequency thereby altering a frequency ratio of the looped output signal over the input signal from a one-half value to a one-fourth value to determine a maximum frequency of the logic path at an overlap between the one-half value and the one-fourth value; and
    at least one frequency divider receiving the looped output signal from the logic path.

12. The circuit of claim 11, wherein the flip flop device is a data flip flop device.

13. The circuit of claim 11, wherein the flip flop device comprises a clock port, a D port and a Q port.

14. The circuit of claim 13, wherein the clock port receives the input signal from the VCO.

15. The circuit of claim 13, wherein the Q port outputs the output signal.

16. The circuit of claim 15, wherein the output signal comprises an intrinsic delay between the clock port and the D port and the clock port and the Q port.

17. The circuit of claim 11, further comprising a second frequency divider receiving the input signal from the VCO.

18. A method, comprising:
    inputting an input signal into a flip flop device;
    looping an output signal of the flip flop device back to the flip flop device through a logic path;
    changing a frequency of the flip flop device from a first setting to a second setting;
    obtaining a frequency ratio of the looped output signal over the input signal in response to the changed frequency;
    determining a maximum frequency of the logic path at a point where the frequency ratio changes from an initial frequency ratio to the frequency ratio; and
    providing the looped output signal from the logic path to a frequency divider.

19. The method of claim 18, wherein the changing of the frequency of the flip flop device from the low setting to the high setting alters the looped output signal.

20. The method of claim 18, further comprising flipping the output signal at the logic path.

* * * * *